(12) United States Patent
Schulze et al.

(10) Patent No.: US 9,166,005 B2
(45) Date of Patent: Oct. 20, 2015

(54) SEMICONDUCTOR DEVICE WITH CHARGE COMPENSATION STRUCTURE

(71) Applicant: Infineon Technologies Austria AG, Villach (AT)

(72) Inventors: Hans-Joachim Schulze, Taufkirchen (DE); Hans Weber, Bayerisch Gmain (DE); Roman Knoefler, Villach (AT); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 104 days.

(21) Appl. No.: 13/782,563

(22) Filed: Mar. 1, 2013

(65) Prior Publication Data

US 2014/0246697 A1 Sep. 4, 2014

(51) Int. Cl.
| | |
|---|---|
| H01L 21/8238 | (2006.01) |
| H01L 29/165 | (2006.01) |
| H01L 29/78 | (2006.01) |
| H01L 29/06 | (2006.01) |

(Continued)

(52) U.S. Cl.
CPC ............ *H01L 29/165* (2013.01); *H01L 21/761* (2013.01); *H01L 29/0646* (2013.01); *H01L 29/0878* (2013.01); *H01L 29/1095* (2013.01); *H01L 29/78* (2013.01); *H01L 29/7802* (2013.01)

(58) Field of Classification Search
CPC ............ H01L 29/1095; H01L 29/0878; H01L 29/7802; H01L 29/0646; H01L 29/165; H01L 29/66712; H01L 21/761; H01L 29/66462; H01L 29/7783
See application file for complete search history.

(56) References Cited

U.S. PATENT DOCUMENTS

| 4,754,310 A | 6/1988 | Coe |
|---|---|---|
| 5,216,275 A | 6/1993 | Chen |

(Continued)

FOREIGN PATENT DOCUMENTS

DE 19808348 C1 6/1999

OTHER PUBLICATIONS

Fan, X., et al., "SiGe/Si superlattice microcoolers," Applied Physics Letters, Mar. 12, 2001, pp. 1580-1582, vol. 78, Issue 11, American Institute of Physics.

(Continued)

*Primary Examiner* — Bac Au
(74) *Attorney, Agent, or Firm* — Murphy, Bilak & Homiller, PLLC

(57) ABSTRACT

A semiconductor device is provided. The semiconductor device includes a semiconductor body having a main surface. In a vertical cross-section which is substantially orthogonal to the main surface the semiconductor body includes a vertical trench, an n-type silicon semiconductor region, and two p-type silicon semiconductor regions each of which adjoins the n-type silicon semiconductor region and is arranged between the n-type silicon semiconductor region and the main surface. The vertical trench extends from the main surface at least partially into the n-type silicon semiconductor region and includes a compound semiconductor region which includes silicon and germanium and is arranged between the two p-type silicon semiconductor regions. The compound semiconductor region and the two p-type silicon semiconductor regions include n-type dopants and p-type dopants. An integrated concentration of the n-type dopants of the compound semiconductor region is larger than an integrated concentration of the p-type dopants of the compound semiconductor region.

11 Claims, 13 Drawing Sheets

(51) Int. Cl.
*H01L 29/10* (2006.01)
*H01L 21/761* (2006.01)
*H01L 29/08* (2006.01)

(56) References Cited

U.S. PATENT DOCUMENTS

| | | | |
|---|---|---|---|
| 5,438,215 | A | 8/1995 | Tihanyi |
| 6,294,418 | B1 | 9/2001 | Noble |
| 6,639,272 | B2 | 10/2003 | Ahlers et al. |
| 6,689,660 | B1 | 2/2004 | Noble et al. |
| 6,777,744 | B2 | 8/2004 | Noble |
| 6,838,729 | B2 | 1/2005 | Schlogl et al. |
| 7,126,186 | B2 | 10/2006 | Weber et al. |
| 7,193,293 | B2 | 3/2007 | Weber et al. |
| 7,582,531 | B2 | 9/2009 | Siemieniec et al. |
| 7,589,378 | B2 | 9/2009 | Kocon et al. |
| 8,309,987 | B2 | 11/2012 | Derluyn et al. |
| 8,633,095 | B2* | 1/2014 | Schulze et al. ............... 438/492 |
| 2002/0135014 | A1 | 9/2002 | Ahlers et al. |
| 2002/0167082 | A1* | 11/2002 | Weber et al. ............... 257/696 |
| 2003/0151087 | A1 | 8/2003 | Weber et al. |
| 2003/0155610 | A1 | 8/2003 | Schlogl et al. |
| 2006/0211189 | A1 | 9/2006 | Siemieniec et al. |
| 2006/0244060 | A1 | 11/2006 | Kapels et al. |
| 2008/0246086 | A1 | 10/2008 | Korec et al. |
| 2009/0039869 | A1 | 2/2009 | Williams |
| 2009/0130806 | A1* | 5/2009 | Sedlmaier et al. ............ 438/192 |
| 2010/0012977 | A1 | 1/2010 | Derluyn et al. |
| 2010/0140694 | A1* | 6/2010 | Tu et al. ..................... 257/333 |
| 2011/0207277 | A1* | 8/2011 | Loechelt et al. .............. 438/270 |
| 2013/0001674 | A1 | 1/2013 | Schulze et al. |

OTHER PUBLICATIONS

Wang, Y., et al., "Simulation study of semi-superjunction power MOSFET with SiGe pillar," Superlattices and Microstructures, Feb. 2, 2010, pp. 314-324, vol. 47, Issue 2, Elsevier Ltd.

Weber, H., "Herstellungsverfahren für ein Kompensationsbauelement / Verfahren zur definierten Ladungstrennung bei doppelt dotierter Ausgangsepischicht," Siemens Disclosure Journal, Jun. 1, 2002, pp. 1-6, Machine translation of title and abstract attached hereto.

* cited by examiner

SEMICONDUCTOR DEVICE WITH CHARGE COMPENSATION STRUCTURE

FIELD OF TECHNOLOGY

The present application relates to semiconductor devices, in particular semiconductor devices with charge compensation structures.

BACKGROUND

Compensation MOSFETs (metal-oxide-semiconductor field-effect transistors) have p-type regions and n-type regions arranged next to each other under the actual device in the active volume in such a way that these regions can mutually 'electrically compensate' for each other during a blocking mode, so that a non-interrupted, low-resistance conductive path is formed in the switched-on state from the source to the drain. Each of the charging regions, also referred to as columns, contain only a fraction of the breakthrough surface charge qc when seen in the horizontal direction. Due to the special type of structure in this case, with a given breakdown voltage, the doping of the n-path can be massively increased for the structural components used for charge compensation compared with conventional structural components. A desirable reduction of switching resistance is achieved in this manner and a distinctly increased added value is therefore also achieved.

However, one part of this added value is typically negated by the increased expense incurred to create the complicated p-type and n-type column regions of the voltage absorbing volume. Conventional manufacturing methods used to create such charge compensation structures are quite complicated and have very high costs, and therefore greatly reduce the added value that is achieved with the compensation structures. In addition, the lower limit of possible dimensions of the charge compensation structures available with existing techniques has been reached, so that further shrinking in size will be difficult to achieve in the next technological generations. A technological transformation has not been realized so far because the required manufacturing tolerances could not be achieved with conventional processes.

Charge compensation components are mainly produced with a so-called 'multiple epitaxy' process. In this case, an n-doped epitaxial layer, which is several µm thick, is first grown on a highly n-doped substrate and commonly referred to as 'buffer epi'. In addition to a doping level introduced in the epitaxial step doping ions are introduced into the buffer epi through a photoresist mask using implantation with the doping ions in the first charging locations (for example boron for phosphorous doping). Counter doping can be also employed with implantation (either through a mask, or on the entire surface). However, it is also possible to separate the individual epitaxial layers with the required doping. After that, the entire process is repeated as much time as required until an n (multi-epitaxial) layer is created which has a sufficient thickness and which is equipped with charge centers. The charge centers are mutually adjusted to each other and vertically stacked on top of each other. These centers are then merged with outward thermal diffusion in an undulating, vertical column to form adjacent p-type and n-type charge compensation regions. The manufacturing of the actual devices can then be conducted at this point. Due to the fact that several expensive epitaxial steps are used including intermediate operations such as photo technology, implantation, etc., the 'multiple epitaxy' process explained above is very expensive and time consuming.

Another conventional technique for fabricating charge compensation components involves trench etching and compensation with trench filling. Initial development of this process included discussions during which both column types (mostly the p-type columns) were defined with trench etching, followed by epitaxial filling to prevent disadvantageous costs which arise when using several different epitaxial layers as explained above with regard to the 'multiple epitaxy' process. At the same time, the volume which absorbs the voltage is deposited in a single epitaxial step (n-doped epi) on a highly n-doped substrate, so that the thickness corresponds to the total thickness of the multilayered epitaxial structure. After that, a deeper trench is etched, which determines the form of the p-column. This trench is then filled with p-doped epi which is free of crystal defects. Indeed, the charging, conditioning and cleaning steps are identical and the actual duration of the process is not the main factor driving the higher cost. On the other hand, the 'multiple epitaxy' process provides savings during the column photo technology steps and results in savings related to many deposits for the epi layers of the columns. Also, with multiple epitaxy, the implantation centers which are stacked on top of each other must be vertically merged together with thermal diffusion.

At the same time, the regions are diffused in the same manner also laterally, which leads to a distinct limit that is imposed on the minimum width of the structure. When the columns are doped already during the initial epi process, just like with the trench filling method, there is no need for such a diffusion step, so that a structure which has very narrow columns can be produced and a higher cost-performance ratio can be achieved. However, the integration of doping by using an epi process is possible only with relatively large fluctuations. In particular with very small dimensions, the corresponding fluctuations quickly exceed the window provided for the process, which can lead to significant yield losses. Also, a vertical variation of the doping profile (and thus also of the vertical development of the strength of the field) is not possible. Various robustness criteria therefore cannot be met.

Another conventional technique for fabricating charge compensation components involves co-doping of the starting material with different quickly diffusing doping atoms followed by trench etching and intrinsic epi filling. However, the problems associated with precise doping are circumvented so that the trench geometry does not change the charging balance. A new characteristic, when compared to the manufacturing concepts discussed so far, is the doping of the epi starting layer. In particular, the epi volume contains both elements $E_p$ (p-type) and $E_n$ (n-type), which later form the p-type and n-type compensation columns in the finished product, although the columns are spatially separated from each other. This 'double doping' can be produced by simultaneously adjusting both of the doping gas currents during the epi growth or so that the entire gas volume consists of a multi-epitaxial sequence, where the doping implantation is not masked and instead both of the doping types are incorporated on the entire surface with the desired doses.

The horizontal levels are merged in the vertical direction with a strong outward diffusion into a continuous (undulating) doped material. Immediately after the starting epitaxy, while both doping materials are not yet spatially separated from each other, they are homogenously distributed in each (intrinsically thin) horizontal layer and mutually compensate for each other or a doping gradient can be built into each of both elements in the vertical direction. As already mentioned, opposite doping polarity must be realized (meaning that one element must have the p-doping effect and the other one must have the n-doping effect. The diffusion coefficients of both doping elements in silicon must be very different with customary diffusion temperatures of around 1,000° C. to 1,250° C. An example of such a doping pair is As (n-doping) and B (p-doping). The diffusion speed of boron is in the given temperature range about three times as high as that of arsenic.

A lateral separation of the doping element in the charge concentration points can be achieved so that the desired doping columns are created by etching a deep trench in the starting epi (which is doped with both doping elements $E_p$ and $E_n$) so that a mesa structure still remains in front of the starting epi. Doing so conserves the horizontal charge balance. An undoped epi layer is then grown on the lateral walls of the trench. This also has no influence on the lateral charge balance. The trench can then be filled at this point. A strong outward diffusion of the doping elements $E_p$ and $E_n$ is carried out after that or at a later point during the process (for example during the device process). Since the diffusion coefficients of both doping elements are very different, a large amount of the doping substance of the faster diffusing element diffuses into the undoped epi layer covering the trench sidewalls. A disproportionally higher ratio of the more slowly diffusing element is diffused into the remaining silicon (Si) mesa layer. One part of the doping amounts is compensated for intrinsically. This occurs in particular in the remaining Si mesa layer. The non-intrinsically compensated doping substance amounts are electrically active, and are determined for each location by the difference in the concentrations of $E_p$ and $E_n$. This effect also substantially builds the doping column. It follows from the description above that with the homogenous doping of the starting epi, no individual processes including etching of the trench, trench wall depositing with epi and column diffusion change the charge balance relative to the starting status of the double-doped starting epi.

The starting epi co-doping/trench etching/intrinsic epi filling technique yields compensation columns with small dimensions, so that the entire amount of the charge can be used to control with precision the voltage increasing volume. However, with this technique, the n-doping atoms never diffuse in silicon faster than the p-doping elements. The charge separation thus occurs mostly because the $E_p$ atoms are diffused out of the pre-deposed region of the $E_p$ atoms, while the $E_n$ profile is hardly changed at all and therefore is only made slightly fluid. This results in several problems.

First, a higher ratio of p-doping atoms remains in the n-type columns, and although they are intrinsically compensated for with an oversupply of $E_n$, the effect on the silicon grid reduces the electric mobility of the electrons (there are about three times as many doping elements in the n column as there are in the p column where no intrinsic compensation takes place). Therefore, although the breakdown voltage is increased in this manner, since the n column carries the load current in the switched-on status of the transistor, this characteristic increases also the switched-on resistance.

Furthermore, the $E_p$ atoms diffuse faster also in the vertical direction than the $E_n$ atoms, creating a more highly doped p-type region under the n-type column, unless a highly doped substrate layer is located under the column. The n-type column should be coupled so that it is conductive with n-conductive compensation components in the downward direction to the rear side of the device. However, this cannot be achieved (due to the p-layer described above) without additional measures.

Also, in order to ensure the robustness of the compensation component, methods were used which were based on the fact that the amounts of the doping substance were varied in the vertical direction in the p-type column and/or in the n-type column. The goal is to produce an electric peak with about a half of the height of the voltage absorbing volume. For precision reasons, the simplest way to achieve this is when the starting epi layer is manufactured with a multilayered epitaxy. The doping is performed with implantation of $E_n$ and $E_p$ on the entire surface in each individual epi level, and the implantation dose can be varied. With a subsequent diffusion (which occurs still before the etching of the trench), the doping substance is vertically distributed throughout the epi volume and therefore throughout the individual epi regions. In this case, the $E_n$ diffusion is much slower than that of $E_p$. When the $E_n$ doped starting epi is diffused at the same time in the vertical direction, the diffusion must be conducted until the doping elements are homogeneously distributed mostly vertically through the epi volume. A doping profile, which is predetermined with the implantation dose for the individual epi level, is therefore not retained (or only an augmented one may remain). Due to these occurrences, it is very difficult to build a vertical doping profile having a high electric robustness.

There is also the fact that a higher percentage of the $E_p$ atoms are diffused in the vertical direction from the voltage absorbing volume, for example into the low laying substrate. The vertical outward diffusion of the $E_p$ atoms interferes with the horizontal charge balance if no measures are taken against the vertical outward diffusion, such as for example buried oxide layers. The vertical outward diffusion of the $E_p$ atoms also has a detrimental influence on the finishing tolerances.

Another conventional technique for fabricating charge compensation components involves doping of the trench sidewalls with implantation. That is, defining the p-type compensation columns can be formed with implantation instead of filling the trench. The trench itself can then be filled with a dielectric, or even remain unfilled and then closed up only in the upward direction. However, this technique results in reflection mechanisms at the sidewall of the trench which plays an important role. Further, the location in which the doping substance is inserted depends to a great deal on the angle of implantation and on the geometry of the trench (the window available for the implantation is not sufficiently large). Moreover, this technique also does not make it possible to vary the charge balance or the relationships between the fields which are related to the depth even though this option is important for charge compensation components, namely in order to ensure the current capability with a full load. Similar performance characteristics are relevant in so-called avalanche switch occurrences.

Another conventional technique for fabricating charge compensation components involves implantation with ultra high energy. The areas that are based on implantation using extremely high energy amounts in theory capture the increasing voltage volume in a single epi step in the depth of the layer. The p-type columns should then be defined by implantation in several stages using different energy levels through a thick surface mask. The required column depth should be achieved with the very high implantation energy level. However, attempts in these areas have not been successful because a suitable masking process is not available.

SUMMARY

According to an embodiment of a semiconductor device, the semiconductor device includes a semiconductor body having a main surface. In a vertical cross-section which is substantially orthogonal to the main surface, the semiconductor body includes a vertical trench, an n-type silicon semiconductor region, two p-type silicon semiconductor regions each of which adjoins the n-type silicon semiconductor region and is arranged between the n-type silicon semiconductor region and the main surface. The vertical trench extends from the main surface at least partially into the n-type silicon semiconductor region and includes a compound semiconductor region which comprises silicon and germanium and is arranged between the two p-type silicon semiconductor regions. The compound semiconductor region and the two p-type silicon semiconductor regions include n-type dopants and p-type dopants. An integrated concentration of the n-type dopants of the compound semiconductor region is larger than an integrated concentration of the p-type dopants of the compound semiconductor region.

According to an embodiment of a semiconductor device, the semiconductor device includes a semiconductor body which includes an n-type silicon semiconductor region and a charge compensation structure. The charge compensation structure includes a p-type silicon semiconductor region which includes n-type dopants and p-type dopants and forms a first pn-junction with the n-type silicon semiconductor region and a compound semiconductor region comprising silicon and germanium and adjoining the n-type silicon semiconductor region and the p-type silicon semiconductor region. An integrated concentration of the n-type dopants in the compound semiconductor region being larger than an integrated concentration of the p-type dopants in the compound semiconductor region.

According to an embodiment of a semiconductor device, the semiconductor device includes a semiconductor body which includes an n-type silicon semiconductor region and a charge compensation structure. The charge compensation structure includes a p-type silicon semiconductor region which includes n-type dopants and p-type dopants and forms a first pn-junction with the n-type silicon semiconductor region. The charge compensation structure further includes a compound semiconductor region adjoining the n-type silicon semiconductor region and comprising silicon and germanium, and a dielectric layer arranged between the p-type silicon semiconductor region and the compound semiconductor region. An integrated concentration of the n-type dopants in the compound semiconductor region being larger than an integrated concentration of the p-type dopants in the compound semiconductor region.

According to an embodiment of manufacturing a semiconductor device, the method includes: providing a semiconductor body including a compensated silicon semiconductor layer and a compound semiconductor region comprising silicon and germanium and extending at least partially through the compensated silicon semiconductor layer, an integrated concentration of n-type dopants of the compensated silicon semiconductor layer being substantially equal to an integrated concentration of p-type dopants of the compensated silicon semiconductor layer, and diffusing more n-type dopants than p-type dopants from the compensated silicon semiconductor layer into the compound semiconductor region so that an integrated concentration of n-type dopants of the compound semiconductor region is larger than an integrated concentration of p-type dopants of the compound semiconductor region.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

A number of embodiments are explained next. Identical structural features are identified by identical or similar reference symbols in the Figures. In the context of the present description, "lateral" or "lateral direction" should be understood to mean a direction or extent that runs generally parallel to the lateral extent of a semiconductor material or semiconductor body. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

Figure 1:
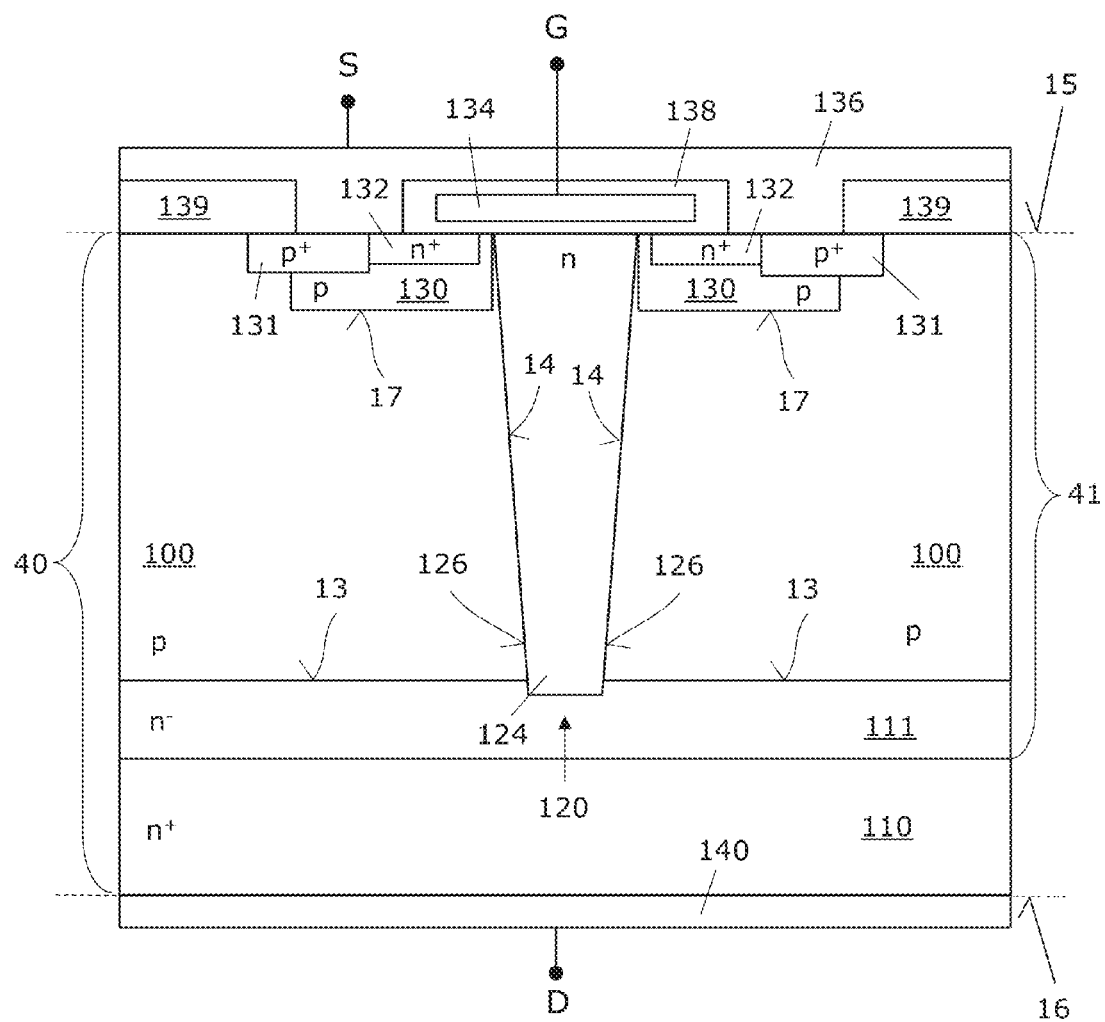
FIG. 1 illustrates a schematic cross-sectional view of a semiconductor device which has a charge compensation structure according to an embodiment.

FIG. 1 illustrates in a vertical cross-section an embodiment of a vertical n-channel charge compensation MOSFET 1000. The compensation structure shown in FIG. 1 in addition to the other compensation structure embodiments described herein can also be applied in a similar manner to other types of semiconductor devices. The semiconductor devices which can use such a compensation structure may be manufactured by different technologies and may include, for example, integrated electrical, electro-optical or electro-mechanical circuits or passives. The semiconductor devices may include inorganic and/or organic materials that are not semiconductors, such as, for example, discrete passives, antennas, insulators, plastics or metals. Furthermore, the devices described below may include further integrated circuits to control the power integrated circuits of the power semiconductor chips.

The semiconductor devices which can use a charge compensation structure as described herein may include power MOSFETs (Metal Oxide Semiconductor Field Effect Transistors), DMOSFETs (Double-diffused MOSFET), IGBTs (Insulated Gate Bipolar Transistors), JFETs (Junction Gate Field Effect Transistors), power bipolar transistors or power diodes such as power Schottky diodes. These types of power semiconductor devices have a vertical structure in that the devices are fabricated in such a way that electric currents can flow in a direction perpendicular to the main faces of these power semiconductor devices. As such, these devices may have terminals such as contacts on two opposing main faces, that is to say on a top side and a bottom side, or, in other words, on a front side and a rear side. By way of example, the source electrode and the gate electrode of a power MOSFET may be situated on one main face, while the drain electrode of the power MOSFET may be arranged on the other main face. The contacts may be made of aluminum, copper or any other suitable material. One or more metal layers may be applied to the contact pads of the power semiconductor chips. The metal layers may, for example, be made of titanium, nickel vanadium, gold, silver, copper, palladium, platinum, nickel, chromium or any other suitable material. The metal layers need not be homogenous or manufactured from just one material, that is to say various compositions and concentrations of the materials contained in the metal layers are possible.

Returning to FIG. 1, the MOSFET 1000 includes a semiconductor body 40 having a main surface 15, an n-type (n-doped) silicon layer 111, which is in the following also referred to as n-type silicon semiconductor region 111, and a p-type silicon layer 100 which forms a first pn-junction 13 with the n-type (n-doped) silicon layer 111 and extends to the main surface 15. The n-type (n-doped) silicon layer 111 may also include a higher doped n-type field-stop region and may be grown on a n+ Si-substrate 110 forming a drain region of the device 1000.

A vertical trench 120 extends from the main surface 15, through the p-type silicon layer 100 and partially into the n-type silicon layer 111. Accordingly, the p-type silicon layer 100 is, at least in the shown vertical cross-section, divided into two p-type silicon semiconductor regions 100 each of which adjoins the n-type silicon semiconductor region 111 (forms the first pn-junction 13 with the n-type silicon semiconductor region 111) and is arranged between the n-type silicon semiconductor region 111 and the main surface 15. In the exemplary embodiment, the trench 120 has two sidewalls 126 which are tapered.

In the exemplary embodiment illustrated in FIG. 1, the vertical trench 120 is filled with a compound semiconductor region 124 which is arranged between and adjoins the two p-type silicon semiconductor regions 100, i.e. forms respective interfaces at the sidewalls 126 with the two p-type silicon semiconductor regions 100. The compound semiconductor region 124 may be a doped silicon-germanium (SiGe) or doped silicon-germanium-carbide (SiGeC), i.e. doped $Si_{1-x-y}Ge_xC_y$.

To reduce mechanical stress and/or lattice defects due to a lattice mismatch between the compound semiconductor region 124 and the adjoining two p-type silicon semiconductor regions 100, the germanium content x of the compound semiconductor region made of $Si_{1-x}Ge_x$ or $Si_{1-x-y}Ge_xC_y$ may vary close to sidewalls 126 of the vertical trench 120, for example increase extending inward from the sidewalls, peak in the core at for example 0.25, and then decrease.

Alternatively or in addition, the transition region at the sidewalls 126 may include a stack of thin layers $Si_{1-z}Ge_z$ of different (step-wise increasing) germanium z content, with z typically being smaller than the germanium content x. The germanium content x in the center of the vertical trench 120 is typically in a range from about 0.1 to about 0.5, more typically in a range from about 0.2 to about 0.4, for example 0.25.

Carbon may be added to further reduce the lattice mismatch between silicon and silicon-germanium. Typically, the carbon content y is smaller than about 0.01. Furthermore, the carbon content y of the compound semiconductor region 124 may vary. Typically, the carbon content y decreases extending inward from the sidewalls 126.

Typically, the compound semiconductor region 124 and the two p-type silicon semiconductor regions 100 form a charge compensation structure having an n-type drift zone which is substantially provided by the compound semiconductor region 124 and compensation regions which are substantially provided by the p-type silicon semiconductor regions 100, respectively. Accordingly, a total amount of n-dopants and p-dopants of the compound semiconductor region 124 and the two p-type silicon semiconductor regions 100 are typically substantially matched in a unit cell of the device 1000 to which the drawing of FIG. 1 may correspond. Note that the semiconductor device 1000 is typically a power semiconductor device having in an active area a plurality of alternating compound semiconductor regions 124 and p-type silicon semiconductor regions 100. In this embodiment, an (mathematically) integrated concentration of the p-type dopants of a compound semiconductor regions 124 and an adjoining p-type silicon semiconductor region 100 typically substantially matches an (mathematically) integrated concentration (dose) of the n-type dopants of the compound semiconductor regions 124 and the adjoining p-type silicon semiconductor region 100.

Both the compound semiconductor region 124 and the two p-type silicon semiconductor regions 100 include the same n-dopants, typically phosphorous atoms, and p-dopants, typically boron atoms. However, the n-dopants outweigh at least on average the p-dopants in the compound semiconductor region 124 while the p-dopants outweigh at least on average the n-dopants in the two p-type silicon semiconductor regions 100. This means that an integrated concentration of the n-type dopants of the compound semiconductor region 124 is larger than an integrated concentration of the p-type dopants of the compound semiconductor region 124 while an integrated concentration of the p-type dopants of the two p-type silicon semiconductor regions 100 is larger than an integrated concentration of the n-type dopants of the two p-type silicon semiconductor regions 100.

Typically, the integrated concentration of the n-type dopants of the compound semiconductor region 124 is larger than the integrated concentration of the p-type dopants of the compound semiconductor region 124 by at least about 50%, more typically by at least about 100% and even more typically by at least about 200%.

Due to the manufacturing, which uses dopant diffusion as explained below with regard to FIGS. 5 to 13, pn-junctions 14 are typically arranged next to the sidewalls 126 and inside the vertical trench 120, i.e. within the compound semiconductor region 124. Accordingly, a typically thin layer, of for example a few nm, of the compound semiconductor region 124 is typically p-type and forms a minor part of the compensation region.

A p-type Si-body region 130 is formed in the epi layer 100, and an n+ Si-source region 132 is formed in the Si-body region(s) 130. The body region 130 is disposed in and has typically a higher maximum doping concentration the respective p-type silicon semiconductor regions 100. A gate electrode 134 is disposed over a channel region of the MOSFET 1000 and coupled to a gate potential (G). A source electrode 136 is insulated from the gate electrode 134 by a dielectric region 138 which also insulates the gate electrode 134 from the semiconductor body 40, and couples the n+ Si-source region(s) 132 to a source potential (S). At the opposite side or back surface 16 of the device 1000 is a drain electrode 140 which couples the n+ Si-substrate (drain region) 110 to a drain potential (D).

The on-state resistance of a conventional high voltage power MOSFET is dominated by the on resistance (Rds_on) of the voltage sustaining drift zone, and the blocking capability of this region is determined by its thickness and doping. In order to advantageously increase the blocking voltage, the doping of the drift zone is conventionally reduced and the layer thickness increased. Doing so conventionally increases the on-state resistance disproportionately in this region as a function of its blocking capability.

When blocking occurs, the voltage is absorbed by the structural components in such a way that the neighboring p-type and n-type regions are mutually cleared up, which is to say that the charge carriers of one region electrically compensate for those in the oppositely doped regions (hence the term compensation structure). Therefore, a capacity is built up in the form of one of the zones which is provided with the depleted zone of the free charge carriers (space charge zone). This induces an electric field in the individual levels with small voltages, which mostly have a horizontal orientation. With increased voltage, a growing part of the volume is horizontally cleared up under the device until at least one of the charge columns arranged next to each other is fully depleted. The horizontal electric field Eh reaches a maximum (EBh). When the voltage is further increased, the clearing up of the n+ charge substrate or deepest deployed surface of the epi layer begins. As a result, the vertical field Ev builds up again (which up until that point did not provide a considerable contribution to the field). The breakdown is reached, and it takes the form of a vertical field with the value EBv for which the following is valid:

$$E_c = |\vec{E}_{Bv} + \vec{E}_{Bh}| \Rightarrow E_{Bv} = \sqrt{E_c^2 - E_{Bh}^2} \quad (1)$$

With corresponding dimensions of the cell, even with very high column doping amounts which provide lower Rds_on, the horizontal field EBh displays only relatively low values so that EBv is on the order of Ec. Therefore, based on:

$$U_B(E_{Bv}; E_{Bh}) = U_{Bv}(E_{Bv}) + U_{Bh}(E_{Bh}) \quad (2)$$

a structural component constructed in this manner can block high voltages in spite of the low resistance Rds_on while Rds_on is limited in conventional power components as given by:

$$R_{on} \infty (U_B)^{2.4 \ldots 2.6} \quad (3)$$

According to the embodiments described herein, the device has a trench 120 which is substantially filled with n-type compound semiconductor material 124 which forms an n-type column in the p-type Si-layer 100. The doping of the n-type column 124 is increased compared to conventional devices (e.g. from n- to n or even higher) to reduce Rds_on in this region. The n-type column 124 provides a vertical current flow path between the source and drain in the on-state. The on-state performance of the transistor is improved by increasing the doping of the n-type column 124.

The Si-material 100 which surrounds the n-type column 124 is doped p-type to form a charge compensation region. In the blocking state, compensation of additional charge is provided by the p-type semiconductor material 100 (and to a much smaller extent by the p-type layer of the compound semiconductor material at the sidewalls of the vertical trench 120) which surrounds the n-type 124 column. In some embodiments, half of the active chip area can be covered by the p-type silicon semiconductor regions 100. During blocking, the p-type silicon semiconductor regions 100 compensate the charge of the adjacent n-type column 124 which results in a high breakdown voltage at an area specific on-resistance below the breakdown limit. Lower on-state resistance is provided without decreasing the blocking voltage capacity of the device by disposing the trench 120 with the n-type column 124 in the p-type material (p-type silicon semiconductor regions 100).

Due to using an Si—Ge-compound semiconductor material as drift region, the on resistance Rds_on of the MOSFET 1000 may be further reduced compared to Si-compensation MOSFETs. For example, a $Si_{75}Ge_{25}$-compound semiconductor material may be used as least as core of the compound semiconductor region 124. While Si has a drift mobility of about 1500 $cm^2/(V\ s)$ for electrons and of about 450 $cm^2/(V\ s)$ for holes, $Si_{75}Ge_{25}$ has a drift mobility of about 2100 $cm^2/(V\ s)$ for electrons and of about 812 $cm^2/(V\ s)$ for holes. This means that the drift velocity of electrons and holes is about 1.4 times and about 1.8 times, respectively, higher in $Si_{75}Ge_{25}$ than in Si while the breakdown field strength is only about 1.2 times lower in $Si_{75}Ge_{25}$ compared to Si. Accordingly, the ratio between on resistance Rds_on and blocking voltage of the semiconductor device 1000 may be improved.

The thermal conductivity is lower for SiGe than for Si. Therefore, a major portion of the ohmic heat which is generated during device operation is distributed through the Si-semiconductor regions, in particular the p-type silicon semiconductor regions 100. This facilitates operating the semiconductor device 1000 at high voltages and/or high current densities.

To further optimize the device performance, in particular device robustness, the concentration of the n-type dopants and the concentration of p-type dopants of the compound semiconductor region 124 and the p-type silicon semiconductor regions 100 may vary in vertical direction.

Figure 2:
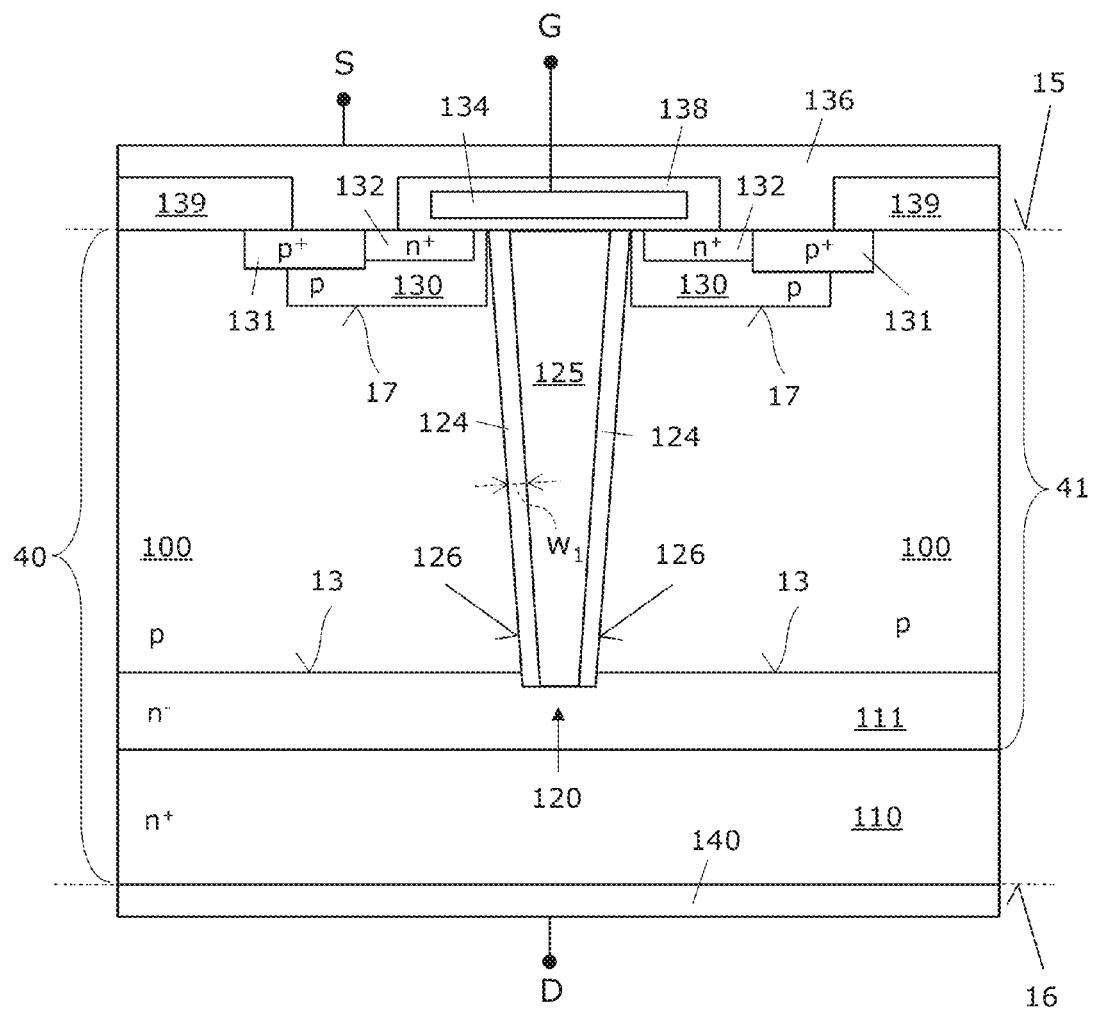
FIG. 2 illustrates a schematic cross-sectional view of a semiconductor device which has a charge compensation structure according to another embodiment.

FIG. 2 illustrates in a vertical cross-section an embodiment of a vertical n-channel charge compensation MOSFET 1001. The MOSFET 1001 is similar to the MOSFET 1000 explained above with regard to FIG. 1. However, the vertical trench 120 of MOSFET 1001 includes a (intrinsic or n-type) silicon core 125 arranged between two compound semiconductor regions 124. Accordingly, heat distribution and/or heat removal may be further increased.

A thickness $w_1$ of the compound semiconductor regions 124 in a normal direction of the interface 126 is typically at least about 400 nm, more typically at least about 1 μm, even more typically at least about 3 μm, for example at least about 5 μm or even at least about 10 μm. Accordingly, a large enough portion of the electric current can flow through semiconductor material (SiGe) of higher charge-carrier mobility.

For the same reason, the compound semiconductor region 124 typically fills at least 25% of the vertical trench 120, more typically at least 50% of the vertical trench 120.

Similar as explained above, the germanium content and/or the carbon content of the compound semiconductor material 124 may vary continuously or step-wise in transition regions next to the sidewalls 126 and/or in transition regions between the compound semiconductor material 124 and the silicon core 125 to reduce the lattice strain (lattice stress).

Figure 3:
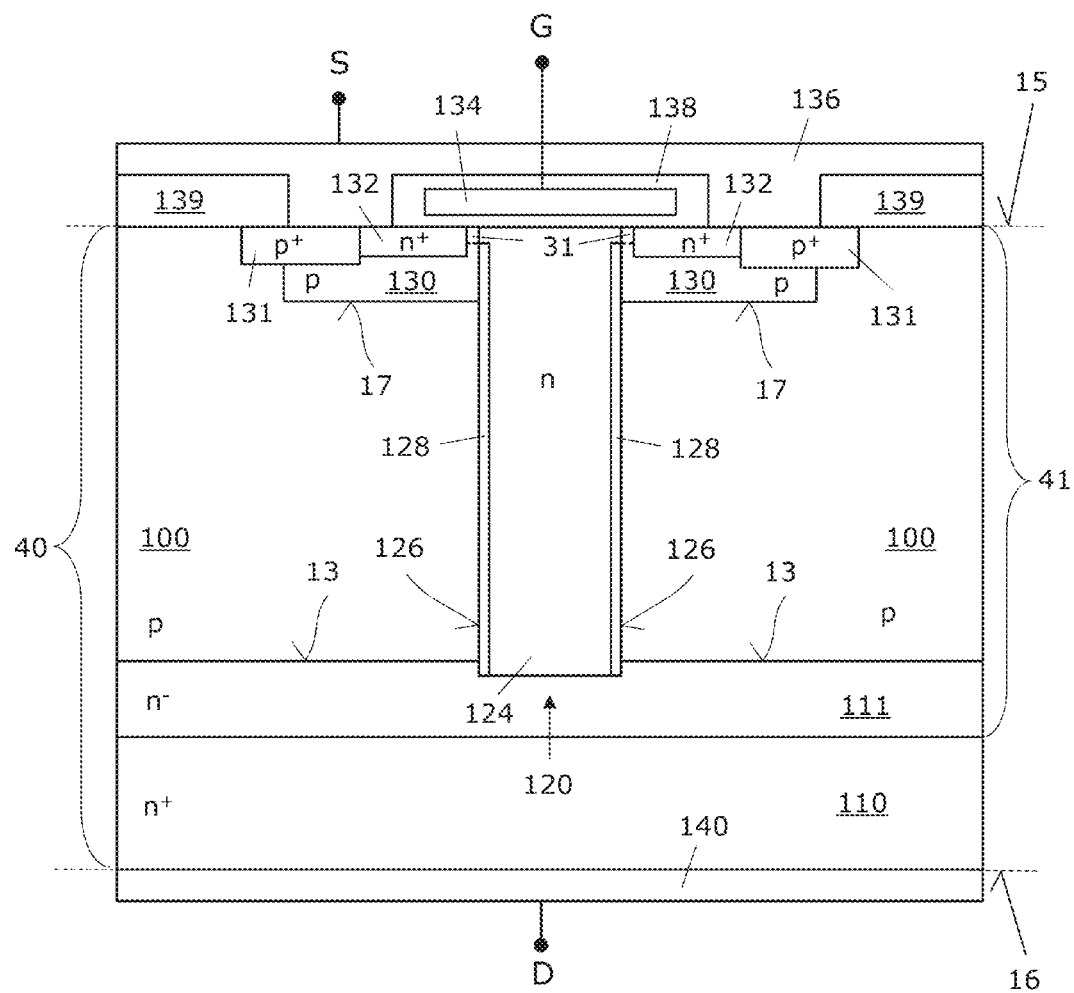
FIG. 3 illustrates a schematic cross-sectional view of a semiconductor device which has a charge compensation structure according to yet another embodiment.

FIG. 3 illustrates in a vertical cross-section an embodiment of a vertical n-channel charge compensation MOSFET 1002. The MOSFET 1002 is similar to the MOSFET 1000 explained above with regard to FIG. 1. However, the vertical trench 120 of MOSFET 1002 has a substantially rectangular cross-section. Furthermore, a dielectric layer 128, for example a thermal silicon oxide, is arranged between each of the p-type silicon semiconductor regions 100 and the compound semiconductor region 124 and at the sidewalls 126, respectively. In the exemplary embodiment, the dielectric layers 128 extend into the n-doped layer 111 but are spaced apart from the main surface 15 by a portion of the compound semiconductor region 124 which adjoins the channel region of the body region 130 and has, for example, a vertical extension of about 10 nm to about 30 nm. Due to the dielectric layers 128, mechanical stress resulting from lattice mismatches between Si and SiGe can for the most part be avoided. Furthermore, the charge carrier mobility in the channel region 31 of the body region(s) 130 may even be increased by the lattice stress due to the mismatch between Si of the channel region 31 and the adjoining compound semiconductor regions 124. In these embodiments, at least the channel region forming portion 31 of the body region(s) 130, which is arranged between a respective n-type source region 132 and the compound semiconductor region 124 and along the dielectric region 138, is typically formed by strained silicon.

The horizontal thickness of the dielectric layers 128 is typically small, for example a few or a few ten nm. Thus heat removal is at most only slightly reduced.

Figure 4:
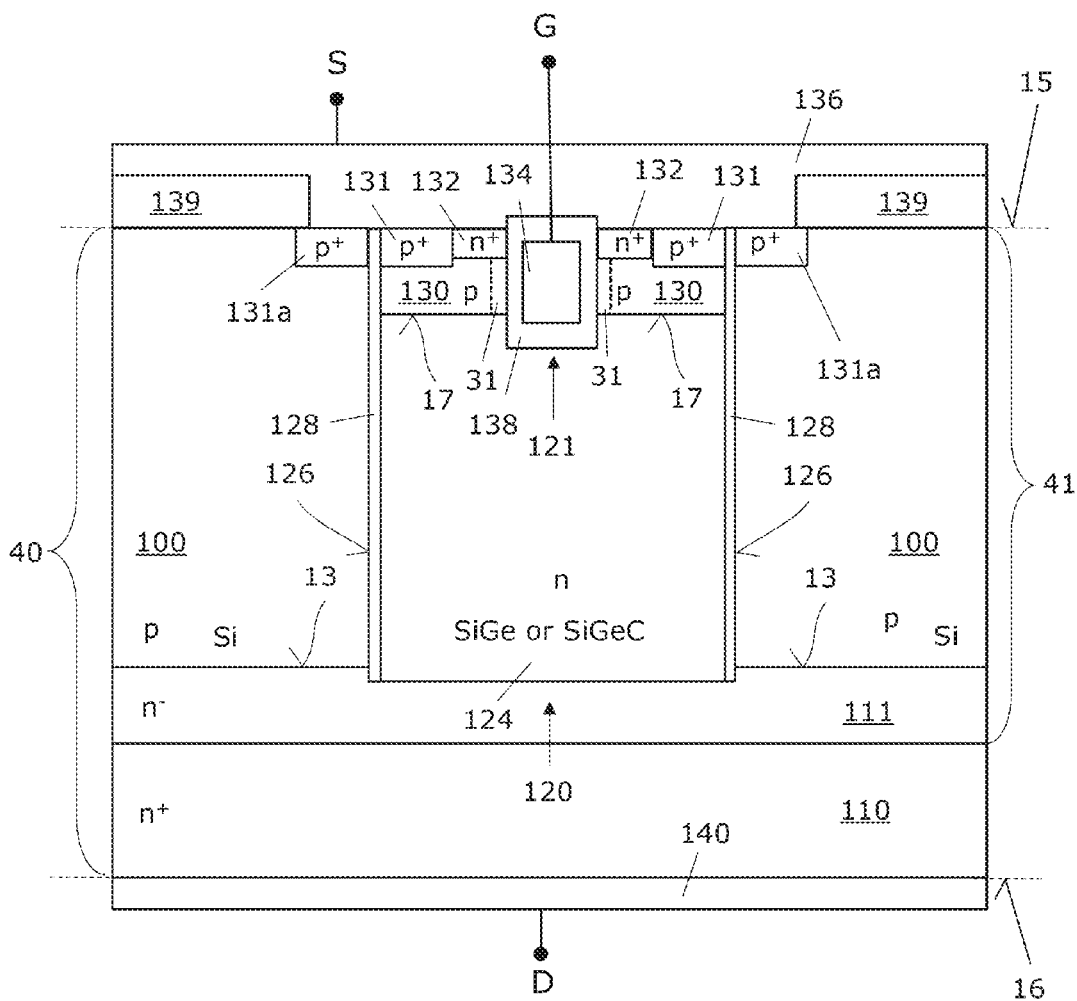
FIG. 4 illustrates a schematic cross-sectional view of a semiconductor device which has a charge compensation structure according to still another embodiment.

FIG. 4 illustrates in a vertical cross-section an embodiment of a vertical n-channel charge compensation MOSFET 1003. The MOSFET 1003 is similar to the MOSFET 1002 explained above with regard to FIG. 3. However, the body region(s) 130, the source regions 132 and the body contact regions 131 of MOSFET 1003 are also compound semiconductor regions and the gate electrode 134 is arranged in a trench 121 extending from the main surface 15 into the drift region 124. Accordingly, the channel region(s) 31 in the respective body region 130 and between the source region 132 and compound semiconductor drift region 124 and the direction of current flow in the channel region(s) 31, respectively, are substantially vertically orientated. Furthermore, the p-type silicon semiconductor regions 100 are connected with the source electrode 136 via respective additional p+ type Si-contact regions 131a.

According to an embodiment, strained silicon is used for the channel regions 31 to further reduce the channel resistance. The strained silicon may be formed by etching thin trenches into the compound semiconductor material and subsequent deposition of silicon.

The semiconductor device 1002, 1003 explained with regard to FIGS. 3, 4 have in common that their charge compensation structure includes a p-type silicon semiconductor region 100 which is doped with n-type dopants (typically phosphorous atoms) and p-type dopants (typically boron atoms) and forms a first pn-junction 13 with an n-type silicon semiconductor region 111, a compound semiconductor region 124 comprising silicon and germanium doped with the same n-type dopants and p-type dopants as the a p-type silicon semiconductor region 100, and a dielectric layer 128 arranged between the p-type silicon semiconductor region 100 and the compound semiconductor region 124. The compound semiconductor region 124 adjoins the n-type silicon semiconductor region 111 and has an integrated concentration of the n-type dopants which is larger than an integrated concentration of the p-type dopants in the compound semiconductor region.

The semiconductor device 1000 to 1003 explained with regard to FIGS. 1 to 4 have in common that their charge compensation structure includes a p-type silicon semiconductor region 100 which is doped with n-type dopants (typically phosphorous atoms) and p-type dopants (typically boron atoms) and forms a first pn-junction 13 with an n-type silicon semiconductor region 111, and a compound semiconductor region 124 comprising silicon and germanium doped with the same n-type dopants and p-type dopants as the a p-type silicon semiconductor region 100. The compound semiconductor region 124 adjoins the n-type silicon semiconductor region 111 and the p-type silicon semiconductor region 100 and has an integrated concentration of the n-type dopants which is larger than an integrated concentration of the p-type dopants in the compound semiconductor region.

The compensation semiconductor device 1000 to 1003 have, due to using SiGe in the drift region 124, a particularly low on-resistance and good thermal properties (heat removal) due to using silicon for the compensation regions 100. This makes compensation semiconductor device 1000 to 1003 particularly interesting for power semiconductor applications.

In the following methods for manufacturing the semiconductor device 1000 to 1003 are explained.

Figure 5:
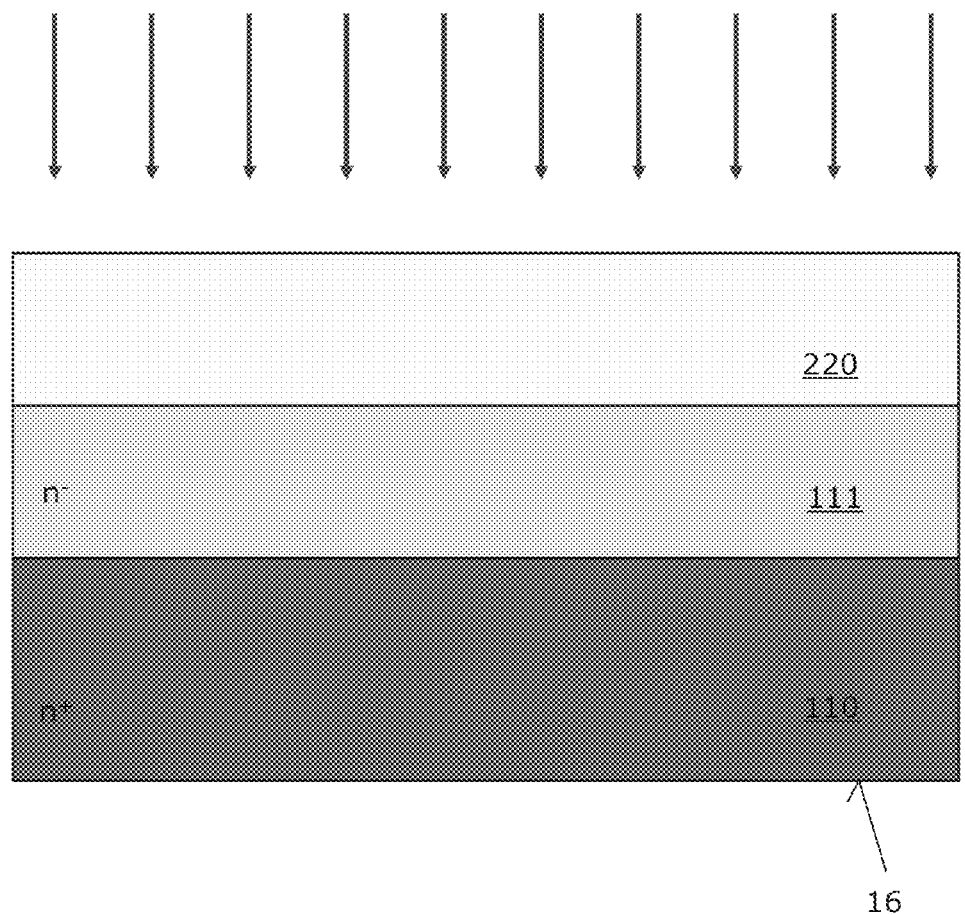
FIGS. 5-13 illustrate a method of manufacturing a charge compensation structure.

FIGS. 5-13 illustrate an embodiment of a method of manufacturing a charge compensation semiconductor device 1000. A preferably nearly intrinsic Si epitaxial layer 220 is grown on an n+ Si substrate 110 or a low doped n-type layer 111 with an optional field stop layer formed on the n+ Si substrate 110, for example as a first epitaxial layer, as shown in FIG. 5.

Figure 6:
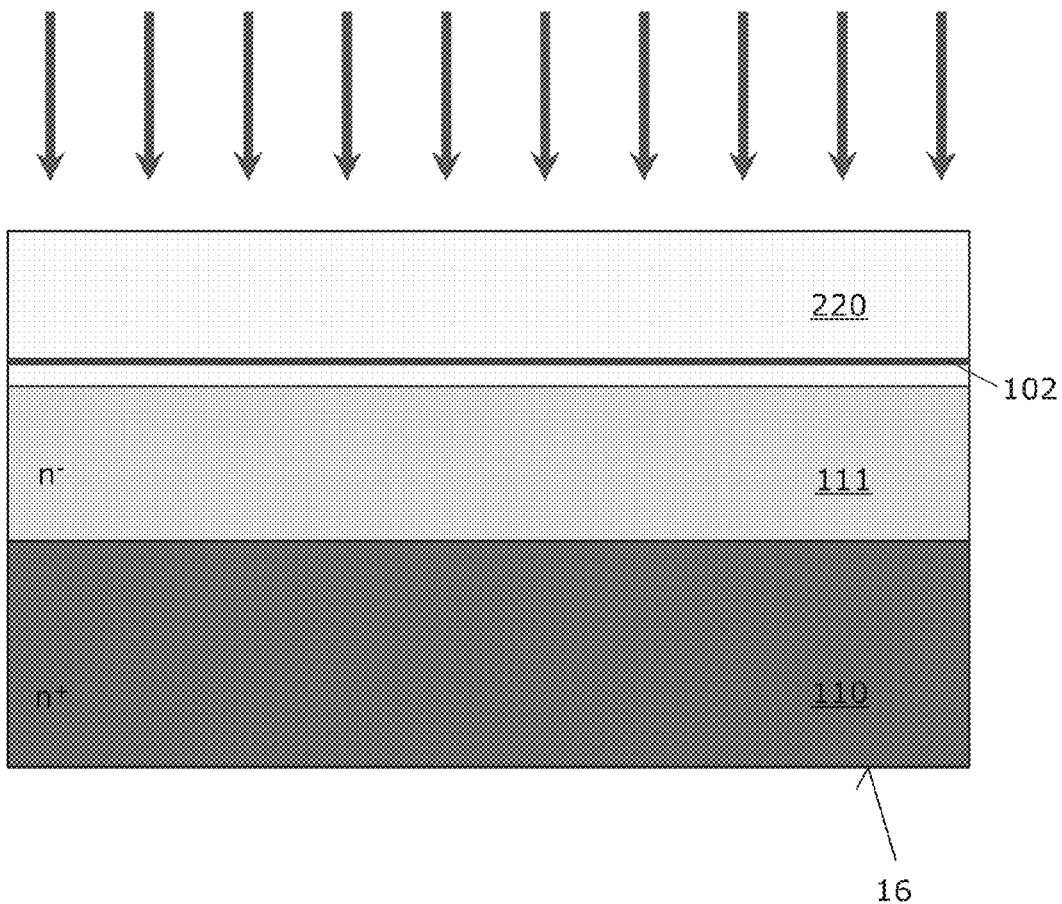
Figure 7:
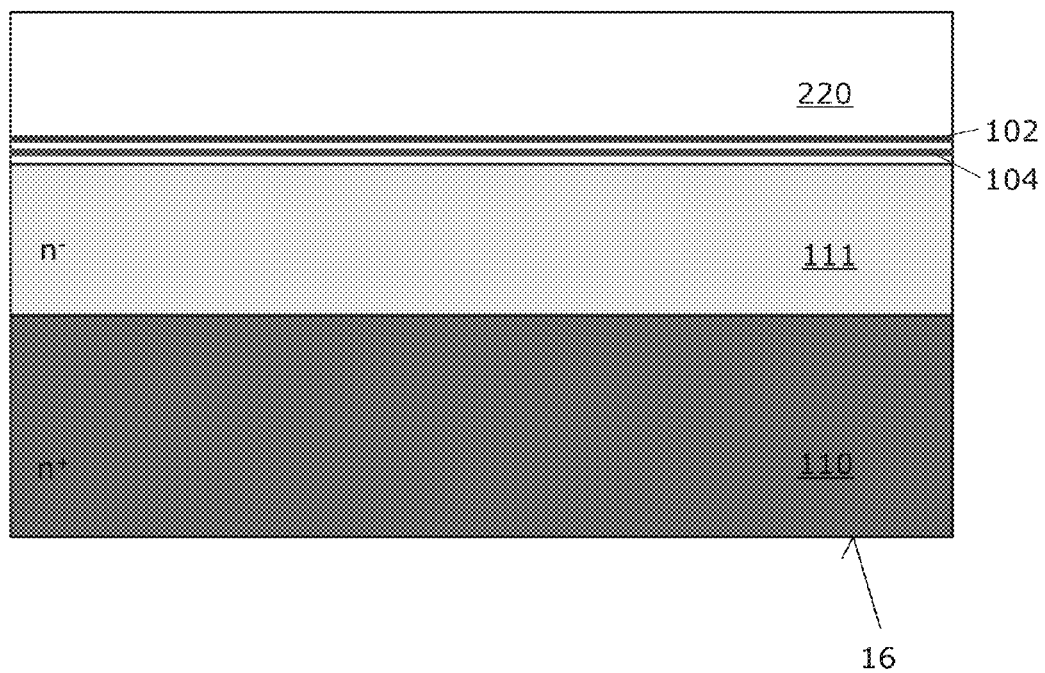

Next, p-type dopant atoms such as boron atoms are implanted into the top surface of the Si epi layer 220 as illustrated by the thin arrows in FIG. 5. Photomasking is not needed during the boron implantation. After implantation, the Si epi layer 220 contains a sub-layer 102 including p-type dopant atoms as shown in FIG. 6. Additionally, n-type dopant atoms such as phosphorous atoms are implanted into the top surface of the Si epi layer 220 as illustrated by the thick arrows in FIG. 6. The same dose may be used for the n-type dopant atoms as for the p-type dopant atoms e.g. between $10^{12}$ to $10^{14}$ atoms/cm$^2$ to fully compensate the Si epi layer 220 with regard to p-type dopant atoms and n-type dopant atoms. The doping doses may also take into account any pre-doping of the Si epi layer 220. Photomasking again is not needed during the phosphorous implantation, and the Si epi layer 220 contains a sub-layer 104 of implanted n-type dopant atoms below the sub-layer 102 with implanted ion of p-type dopant atoms as shown in FIG. 7. The p-type and n-type implanted sub-layer or regions 102, 104 can be at the same depth, or at different depths as shown in FIG. 7. Furthermore, different p-dopant and n-dopant implantations in different depths of the Si epi layer 220 may be used, for example with varying doses to control the vertical profile of the semiconductor device. By controlling the vertical profile as desired, the electric field profile is correspondingly controlled.

Figure 8:
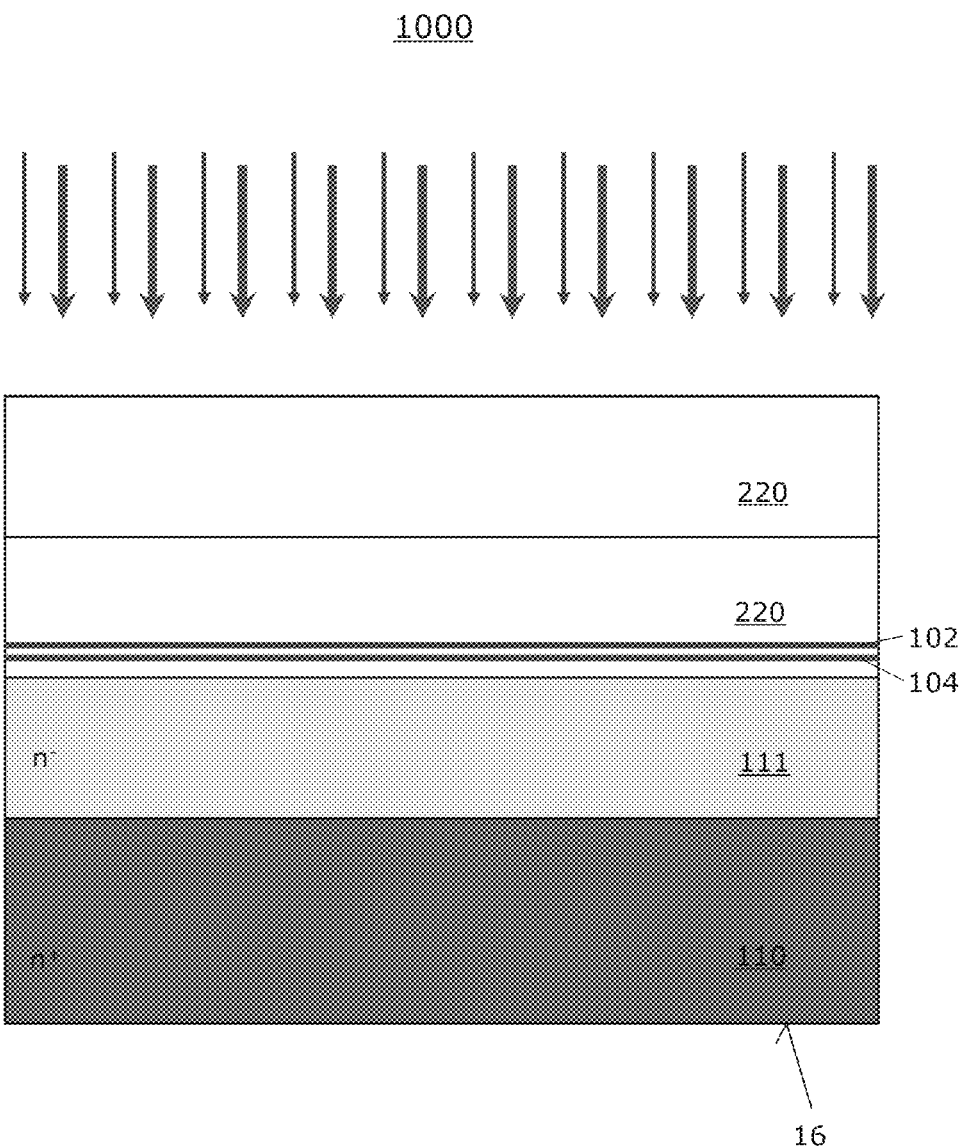
Figure 9:
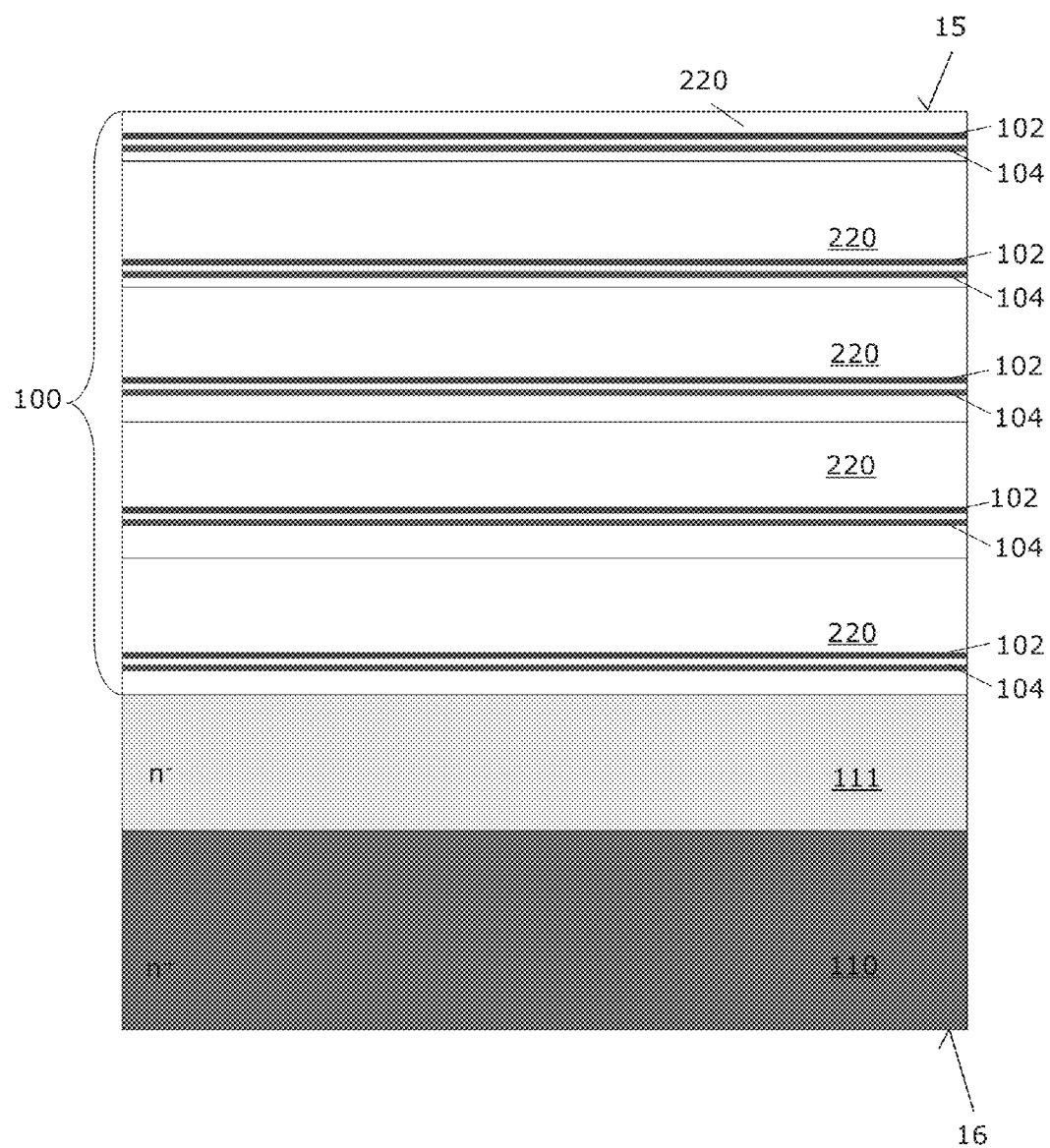
Figure 10:
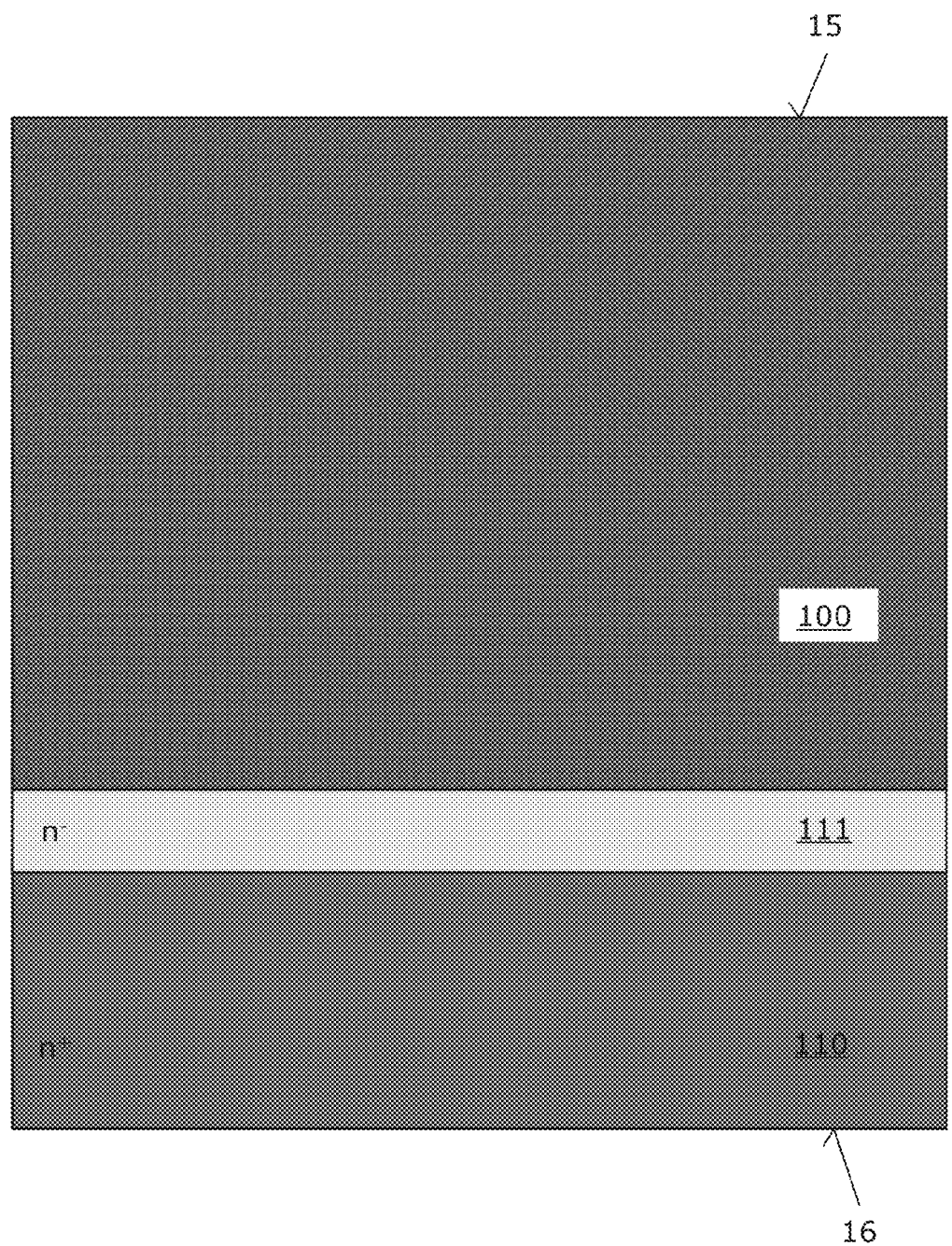

Thereafter, a further Si epi layer 220 may be grown on the original Si epi layer 220 and p-type and n-type implantation, at the same or different doses as before, are performed again for the further Si epi layer 220 as illustrated in FIG. 8. The epi growth and implantation processes can be repeated a desired number of times until a suitably thick multilayered epi layer 100 with vertically stacked n-type and p-type dopant sub-layers or regions 102, 104 is realized as shown in FIG. 9. With such a multi-layered epitaxy 100, the implantation doses can be varied in each separate Si epi layer 220 which is then followed by a diffusion of the individual implanted regions 102, 104 until the entire multilayered epi 230 is penetrated with an undulating doping substance as shown in FIG. 10. That is, the outdiffusion of the implanted dopant regions 102, 104 formed in the different Si epi layers 220 yields a co-doped multi-layered epi 100 having a substantially homogenous distribution of p-type and n-type dopant atoms throughout or a smooth vertical profile because the doping element pair (En and Ep) quickly diffuses in Si approximately equally. The diffusion constants of the implanted p-dopant and n-dopant atoms may be nearly equal i.e. the diffusion constants may differ by less than 50%, and preferably by less than 20%. For this, boron and phosphorous are suitable dopant atoms. The epi volume is therefore fully or at least nearly compensated. An alternative to the multilayered epi process described above involves using a single continuous epi layer and providing doping gas currents that form an epi material which is fully compensated as described above. In either case, a homogenously co-doped epi material 100 is achieved. Alternatively, the doses of one or more of the n-type and/or p-type regions 202, 204 can vary over at least a part of the vertical depth of the multilayered epi 100 so that a corresponding vertical profile is defined as previously described herein.

In one embodiment, the co-doped epi material 100 is doped homogenously with the n-type dopant atoms and the p-type dopant atoms in the lateral direction extending parallel to a main surface 15 of the epi material 100 so that the epi 100 has a dopant variation of less than 3% or more preferably less than 1% in the lateral direction. The epi material 100 can be doped non-homogenously in the vertical direction extending perpendicular to the main surface 15 so that the dopant variation in the vertical direction is greater than 1% and typically less than 50%. This way, there is little variation in the dopant concentration in the lateral direction (horizontal direction) and a much greater variation in the vertical direction. As a result, certain regions of the co-doped epi material 100 can be doped more heavily that others e.g. to provide a breakdown structure within the drift zone of the device. Indeed, a doping variation in the vertical direction may be desirable to increase the breakdown robustness of the device. For example, the epi layer(s) in about half the depth of the co-doped epi material 100 may be doped more heavily than the lower epi layers to form a breakdown structure at the main surface 15 of the device after diffusion. In each case, the co-doped epi material 100 is at least nearly fully compensated in that a dopant concentration difference of less than 10 to 20% is realized throughout the entire epi volume.

Figure 11:
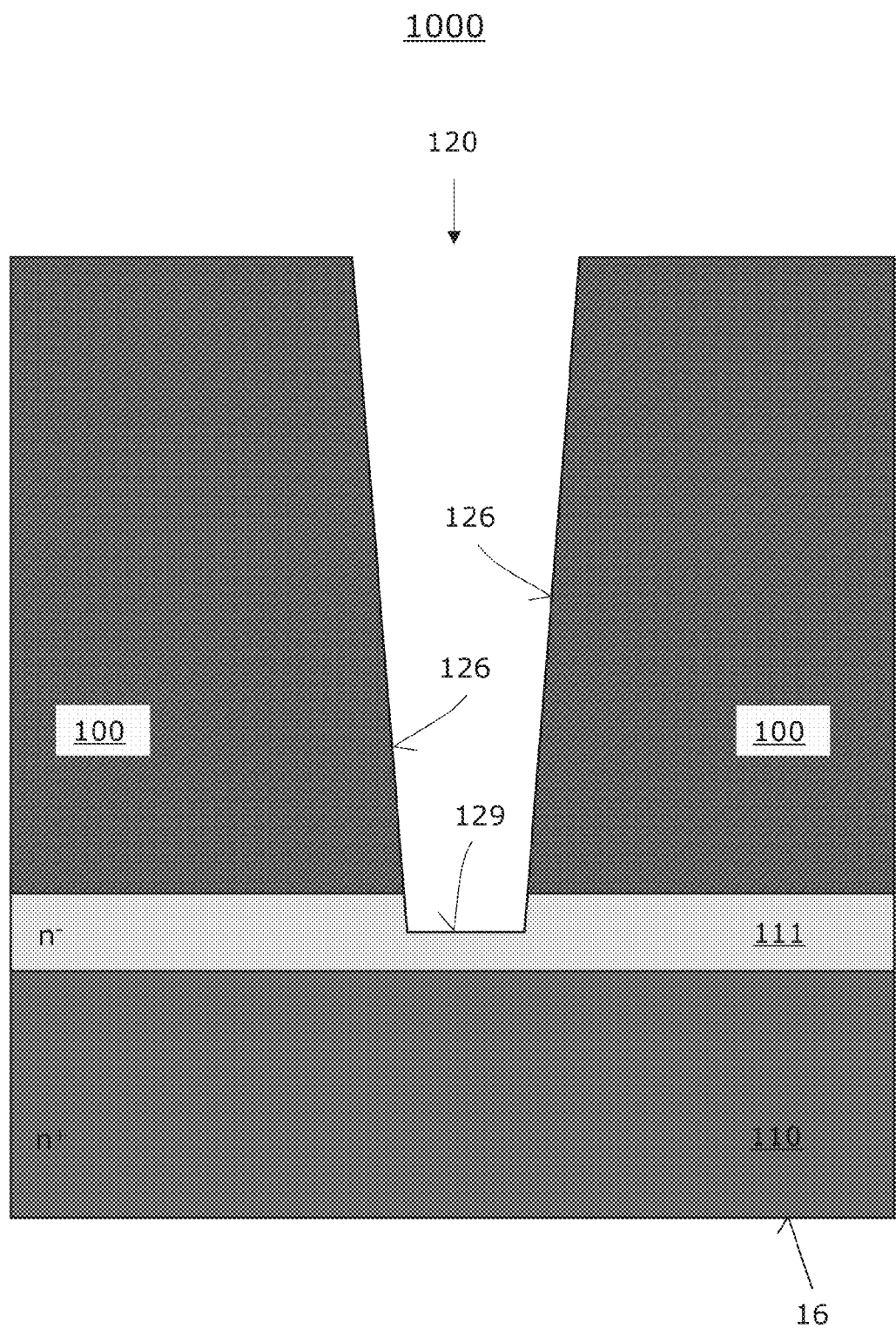

After forming the co-doped epi material 100, a vertical trench 120 with sidewalls 126, for example tapered sidewalls 126, and a bottom wall 129 is etched into the co-doped epi material 100 as shown in FIG. 11. In one embodiment, the trench etching process is stopped prior to reaching the substrate 110. Typically, the vertical trench 120 is partly etched into the into the n-doped layer 111.

Figure 12:
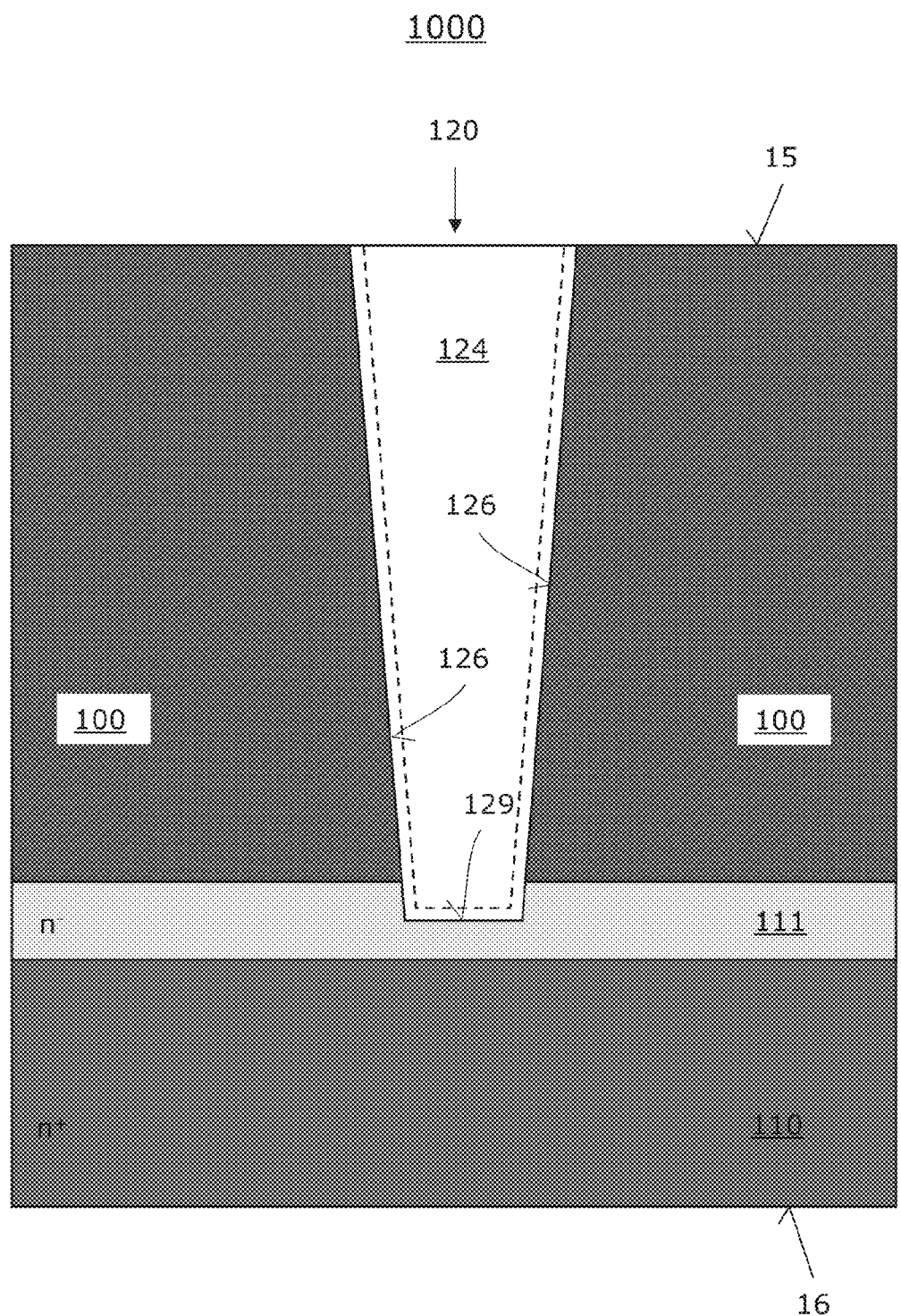

Thereafter, the vertical trench 120 is at least substantially filled with a substantially intrinsic compound semiconductor region 124 comprising silicon and germanium (SiGe, SiGeC) as illustrated in FIG. 12. This may be done by deposition and a subsequent planarization process, for example a CMP-process The intrinsic compound semiconductor region 124 preferably does not contain any electrically active doping or at least as little as possible.

The compound semiconductor material 124 may be deposited along one or more of the trench sidewalls 126 as shown in FIG. 12, for example by epitaxially growth to form conformal layers.

Alternatively, the vertical trench 120 can be filled with SiGe or SiGeC and then removed except along the sidewalls 126. The vertical trench is then filled with intrinsic SiGe, SiGeC of a different composition or even with intrinsic Si.

The compound semiconductor material 124 may be formed on silicon without dislocation in that no (or few) crystalline defects are produced in the neighboring silicon. This may be facilitated by forming a stack of alternating thin Si/compound semiconductor layers each of which is lower than about 10 nm to avoid grid defects, and/or by varying the germanium content and/or the carbon content of the compound semiconductor material 124 in a transition region next to the sidewalls 126 and/or the bottom wall 129. The germanium content may increase extending inward from the sidewalls 126, peak, and then decrease. The carbon content may decrease with the distance from the sidewalls 126 and/o the bottom wall 129. By doping the SiGe at the trench sidewall material with a small amount of carbon (e.g. about 1%), a perfect (or near perfect) matching with silicon is achieved with a correct composition of the SiGe grid. SiGeC as the trench sidewall material therefore yields no significant differences in the grid constant. SiGe and SiGeC have an inert conduct toward the Si crystal, meaning that the charge balance that was adjusted with boron and phosphorous is not distorted.

The remaining trench volume is typically filled with SiGe. In another embodiment, the central core of the trench may be filled with substantially intrinsic silicon when a semiconductor device as explained above with regard to FIG. 2 is to be formed. In this embodiment, a similar strain reducing transition region with varying carbon and/or germanium content is typically formed between the compound semiconductor material 124 at the sidewalls 126, which is typically thicker than about 400 nm, and the silicon core.

The processes explained with regard to FIGS. 5 to 12 may be described as providing a semiconductor body which includes a compensated silicon semiconductor layer 100, for example a co-doped the Si epi material 100, and a compound semiconductor region 124 comprising silicon and germanium and extending at least partially through the compensated silicon semiconductor layer 100, wherein an integrated concentration of n-type dopants of the compensated silicon semiconductor layer 100 is substantially equal to an integrated concentration of p-type dopants of the compensated silicon semiconductor layer 100. Typically, the diffusion constants for n-type (En) and p-type (Ep) dopant atoms are different in the compound semiconductor region 124.

Typically, the compound semiconductor region 124 has a dopant diffusion constant which is at least 2×, or at least 3×, or even at least 5× higher for n-type dopant atoms than p-type dopant atoms. As such, the n-type dopants, which are typically phosphorous atoms, may readily be diffused into the compound semiconductor region 124 while the p-type dopants, which are typically boron atoms, are mainly restrained in the silicon. Note that in silicon, phosphorous and boron diffuse under the usual process conditions at approximately the same speed. In SiGe however, the n-doping element phosphorus displays a distinctly higher diffusion constant than p-doping element boron. For example, $Si_{0.76}Ge_{0.24}$ displays a diffusion constant for phosphorus that is about one order of magnitude higher than for boron.

Figure 13:
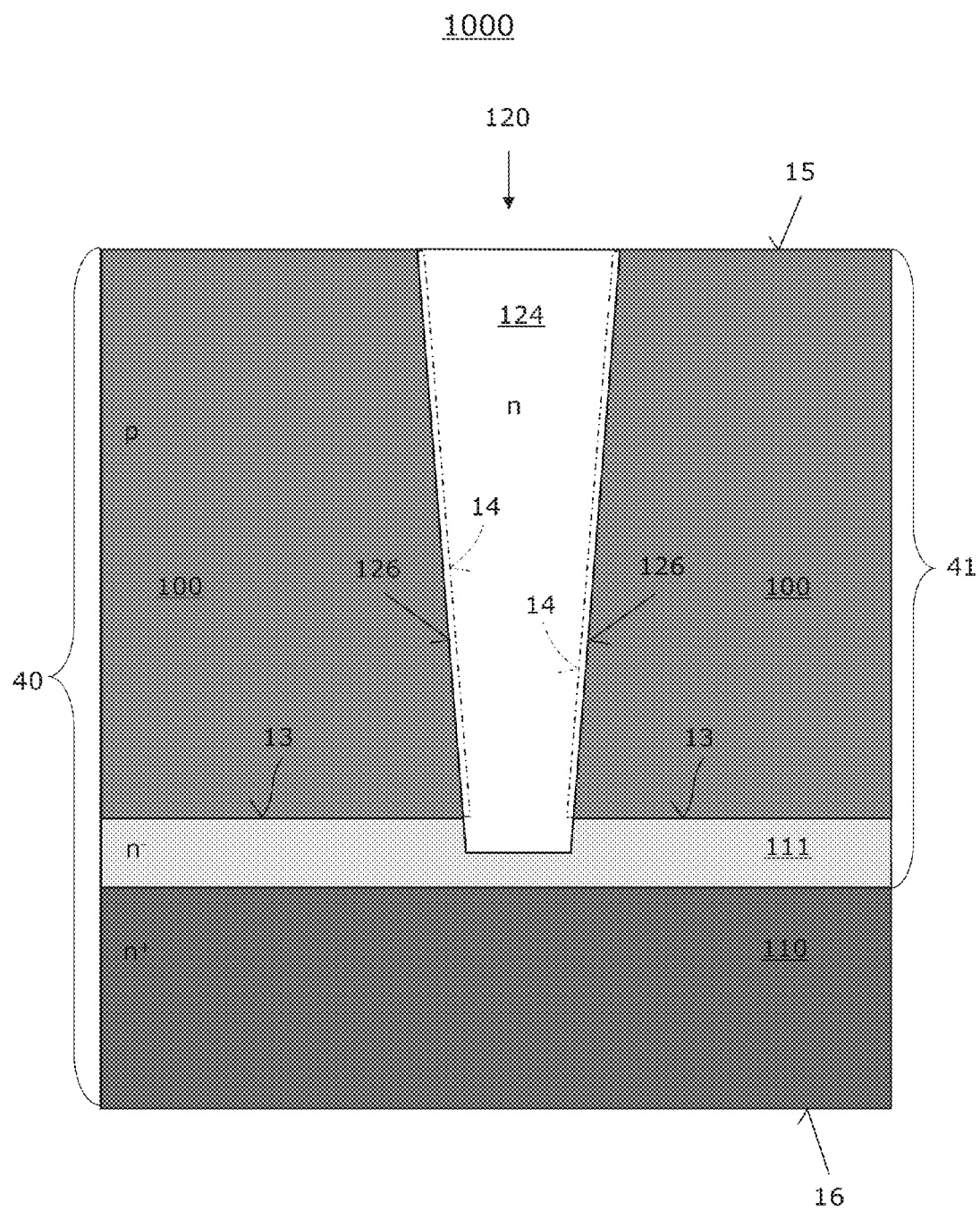

In a subsequent thermal diffusion process, more n-type dopants than p-type dopants diffuse from the compensated silicon semiconductor layer 100 into the compound semiconductor region 124 so that an integrated concentration of n-type dopants of the compound semiconductor region 124 is larger than an integrated concentration of p-type dopants of the compound semiconductor region 124. Accordingly, a charge compensation column structure with p-type silicon semiconductor regions 100 and an-n-type compound semiconductor region 124 is formed as shown in FIG. 13. Due to partly in-diffusing of p-type dopants into the compound semiconductor region 124, the pn-junction 14 of the charge compensation column structure is typically formed in the compound semiconductor region 124 next to the sidewalls 126.

The thermal diffusion process is typically carried out for several hours at diffusion temperature of for example about 950° C. to about 1100° C.

In one embodiment, a trench or deep trench is etched from the main surface 15 into the compound semiconductor region 124 next to each of the sidewalls 126 to remove at least a portion of a respective transition region between Si and SiGe which may include lattice defects and/or cause strain. This may include removing an adjoining layer of the p-type silicon semiconductor regions 100. Typically, the deep trenches extend into the n-doped layer 111.

Thereafter, an insulating (dielectric) material, for example a silicon oxide, may be formed at least on the sidewalls of a lower portion of the deep trenches. When a semiconductor device 1003 as illustrated in FIG. 4 is be manufactured, the deep trenches may completely be filled with a dielectric material 128 but may also include voids. When a semiconductor device 1002 as illustrated in FIG. 3 is be manufactured, the uppermost portion of the deep trenches is again filled with Si, SiGe or SiGeC to enable a current path through the compound semiconductor region 124.

Thereafter, body regions, source regions, body contact regions and/or p+ type Si-contact regions may be formed next to the main surface 15. Further, an insulated gate electrode may be formed next to the main surface 15. Thereafter, a source electrode may be formed on the main surface 15 and a drain electrode may be formed opposite to the source electrode.

In so doing, compensation semiconductor devices, for example compensate MOSFETs, with a well-balanced doping relation may be manufactured in an efficient way.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, comprising:
   providing a semiconductor body having a main surface and comprising a compensated silicon semiconductor layer extending to the main surface, and a substantially intrinsic compound semiconductor region comprising silicon and germanium and extending at least partially through the compensated silicon semiconductor layer, an integrated concentration of n-type dopants of the compensated silicon semiconductor layer being substantially equal to an integrated concentration of p-type dopants of the compensated silicon semiconductor layer; and
   diffusing more n-type dopants than p-type dopants from the compensated silicon semiconductor layer into the substantially intrinsic compound semiconductor region to form a compound semiconductor drift region of the semiconductor device, the compound semiconductor drift region having a larger integrated concentration of n-type dopants than p-type dopants, in a cross-section substantially orthogonal to the main surface the compound semiconductor drift region at least substantially filling a vertical trench extending from the main surface at least partially through the compensated silicon semiconductor layer.

2. The method of claim 1, wherein providing the semiconductor body comprises at least one of:
   disposing on a silicon substrate at least one silicon semiconductor layer;
   implanting the n-type dopants and/or the p-type dopants into the at least one silicon semiconductor layer so that the integrated concentration of the n-type dopants of the at least one silicon semiconductor layer is substantially equal to the integrated concentration of the p-type dopants of the at least one silicon semiconductor layer;
   diffusing the n-type dopants and/or the p-type dopants to form the compensated silicon semiconductor layer;
   etching the vertical trench into the compensated silicon semiconductor layer; and
   disposing a substantially intrinsic compound semiconductor material comprising silicon and germanium at least along one or more sidewalls of the vertical trench.

3. The method of claim 2, wherein disposing the substantially intrinsic compound semiconductor material comprises epitaxially growing SiGe or SiGeC on the one or more sidewalls of the vertical trench.

4. The method of claim 2, wherein the vertical trench is etched so that the sidewalls are tapered.

5. The method of claim 2, wherein the germanium content of the compound semiconductor region increases extending inward from the sidewalls, peaks, and then decreases.

6. The method of claim 2, wherein the substantially intrinsic compound semiconductor material is deposited with a minimum thickness of at least 1 μm in a direction perpendicular to at least one of the at least one or more sidewalls.

7. The method of claim 1, wherein the compensated silicon semiconductor layer is doped homogenously with the n-type dopants and the p-type dopants in a lateral direction extending parallel to a main surface of the semiconductor body so that the compensated silicon semiconductor layer has a dopant variation of less than 3% in the lateral direction.

8. The method of claim 1, wherein the compensated silicon semiconductor layer is doped non-homogenously in a vertical direction extending perpendicular to a main surface of the semiconductor body so that a dopant variation of the compensated silicon semiconductor layer in the vertical direction is greater than 1% and less than 50%.

9. The method of claim 1, wherein the n-type dopants are phosphorous atoms and the 10. The method of claim 1, further comprising, after diffusing more n-type dopants than p-type dopants from the compensated silicon semiconductor layer into the compound semiconductor region to form the compound semiconductor drift region etching a trench into the compound semiconductor drift region.

11. The method of claim 10, further comprising:
   forming an insulating material at least in a portion of the trench.

* * * * *

UNITED STATES PATENT AND TRADEMARK OFFICE
CERTIFICATE OF CORRECTION

| | |
|---|---|
| PATENT NO. | : 9,166,005 B2 |
| APPLICATION NO. | : 13/782563 |
| DATED | : October 20, 2015 |
| INVENTOR(S) | : H. Schulze et al. |

It is certified that error appears in the above-identified patent and that said Letters Patent is hereby corrected as shown below:

Claims

Column 16, line 53 (claim 9, line 2) please change "and the" to -- and the p-type dopants are boron atoms. --

Signed and Sealed this
Twenty-ninth Day of March, 2016

Michelle K. Lee
*Director of the United States Patent and Trademark Office*